(12) United States Patent
Wang et al.

(10) Patent No.: US 9,978,745 B2
(45) Date of Patent: May 22, 2018

(54) BIPOLAR JUNCTION TRANSISTOR

(71) Applicant: UNITED MICROELECTRONICS CORP., Hsin-Chu (TW)

(72) Inventors: Kuan-Ti Wang, Kaohsiung (TW); Ling-Chun Chou, Yun-Lin County (TW); Kun-Hsien Lee, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 7 days.

(21) Appl. No.: 15/289,988

(22) Filed: Oct. 11, 2016

(65) Prior Publication Data
US 2018/0068998 A1    Mar. 8, 2018

(30) Foreign Application Priority Data

Sep. 2, 2016 (TW) .............................. 105128444 A

(51) Int. Cl.
*H01L 27/082* (2006.01)
*H01L 29/06* (2006.01)
*H01L 27/02* (2006.01)

(52) U.S. Cl.
CPC ........ *H01L 27/082* (2013.01); *H01L 27/0207* (2013.01); *H01L 29/0649* (2013.01); *H01L 29/0657* (2013.01)

(58) Field of Classification Search
CPC ............... H01L 27/082; H01L 27/0207; H01L 27/1022; H01L 27/1023; H01L 27/1024; H01L 27/1025; H01L 27/0821; H01L 27/0823; H01L 29/0649; H01L 29/0657
See application file for complete search history.

(56) References Cited

U.S. PATENT DOCUMENTS

| 7,700,449 B2 * | 4/2010 | Lee | H01L 21/823431 |
| | | | 257/350 |
| 2010/0187656 A1 * | 7/2010 | Ke | H01L 29/73 |
| | | | 257/586 |

* cited by examiner

*Primary Examiner* — Laura Menz
*Assistant Examiner* — Candice Y Chan
(74) *Attorney, Agent, or Firm* — Winston Hsu

(57) ABSTRACT

A bipolar junction transistor (BJT) includes a semiconductor substrate and a first isolation structure. The semiconductor substrate includes a first fin structure disposed in an emitter region, a second fin structure disposed in a base region, and a third fin structure disposed in a collector region. The first, the second, and the third fin structures are elongated in a first direction respectively. The base region is adjacent to the emitter region, and the base region is located between the emitter region and the collector region. The first isolation structure is disposed between the first fin structure and the second fin structure, and a length of the first isolation structure in the first direction is shorter than or equal to 40 nanometers. An effective base width of the BJT may be reduced by the disposition of the first isolation structure, and a current gain of the BJT may be enhanced accordingly.

20 Claims, 7 Drawing Sheets

BIPOLAR JUNCTION TRANSISTOR

BACKGROUND OF THE INVENTION

1. Field of the Invention

The present invention relates to a bipolar junction transistor (BJT), and more particularly, to a bipolar junction transistor including a semiconductor fin structure.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Transistors are important semiconductor devices in the integrated circuits. There are many kinds of transistors. For example, the transistors include bipolar junction transistors and field effect transistors with different operating principles. In recent years, with the increasing miniaturization of electronic products, there is a development for three-dimensional or non-planar field effect transistors (FETs) such as fin field effect transistors (Fin-FETs) for replacing the planar FETs. However, for the related field, it is still important to work out a manufacturing method of fin type bipolar junction transistors with high performance and being integrated with the manufacturing method of the Fin-FETs.

SUMMARY OF THE INVENTION

It is one of the objectives of the present invention to provide a bipolar junction transistor. An isolation structure with a shorter length is used to isolate a fin structure in an emitter region and a fin structure in a base region for reducing an effective base width of the bipolar junction transistor, and the current gain of the bipolar junction transistor may be increased accordingly.

A bipolar junction transistor is provided in an embodiment of the present invention. The bipolar junction transistor includes a semiconductor substrate and a first isolation structure. The semiconductor substrate includes a first fin structure, a second fin structure, and a third fin structure. The first fin structure is disposed in an emitter region, the second fin structure is disposed in a base region, and the third fin structure is disposed in a collector region. The first fin structure, the second fin structure, and the third fin structure are elongated in a first direction respectively. The base region is adjacent to the emitter region, and the base region is located between the emitter region and the collector region. The first isolation structure is disposed between the first fin structure and the second fin structure, and a length of the first isolation structure in the first direction is shorter than or equal to 40 nanometers.

In the bipolar junction transistor of the present invention, the isolation structure configured to separate the fin structure in the emitter region and the fin structure in the base region may be formed by the process of forming a diffusion break configured to separate two adjacent semiconductor devices on the same fin structure. Accordingly, the isolation structure may be shorter than a shallow trench isolation structure generally formed between the fin structures, and the effective base width of the bipolar junction transistor may be reduced for enhancing the current gain of the bipolar junction transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
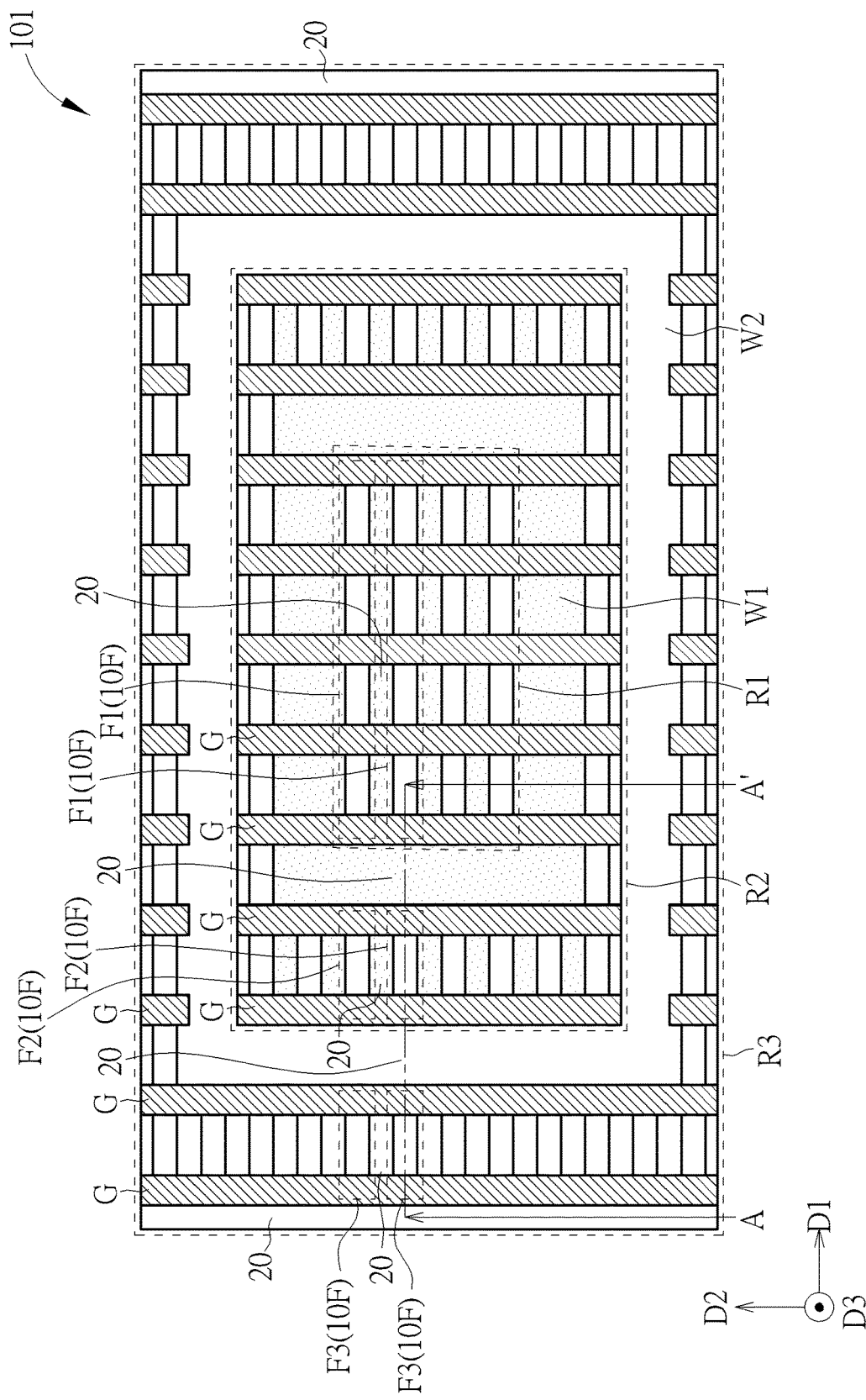
FIG. 1 is a schematic drawing illustrating a bipolar junction transistor according to a first embodiment of the present invention.
Figure 2:
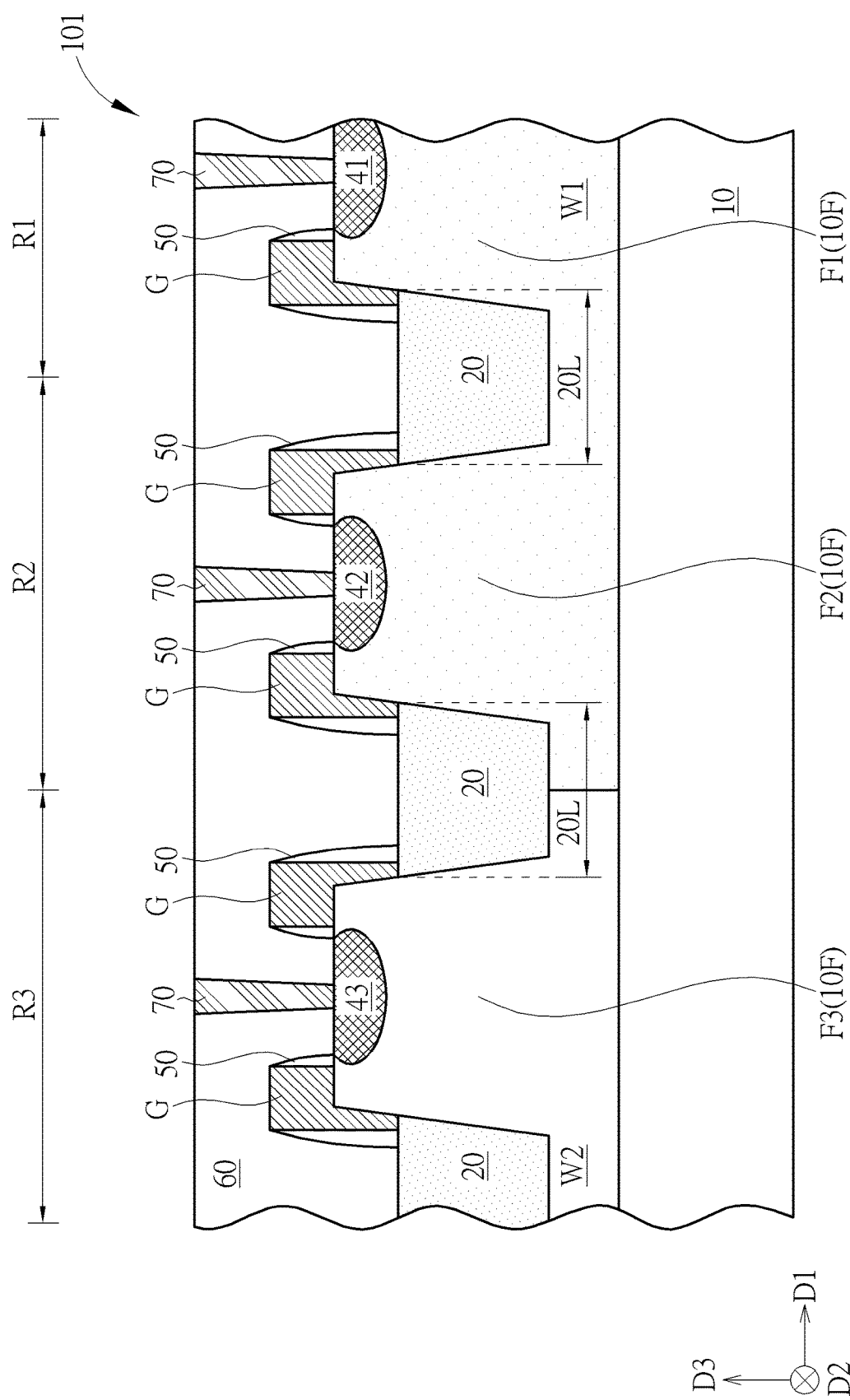
FIG. 2 is a cross-sectional diagram taken along a line A-A' in FIG. 1.

Please refer to FIG. 1 and FIG. 2. FIG. 1 is a schematic drawing illustrating a bipolar junction transistor according to a first embodiment of the present invention. FIG. 2 is a cross-sectional diagram taken along a line A-A' in FIG. 1. As shown in FIG. 1 and FIG. 2, a bipolar junction transistor 101 is provided in this embodiment. The bipolar junction transistor 101 includes a semiconductor 10. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The semiconductor substrate 10 includes at least one fin structure 10F, and the fin structure 10F may include a fin structure made of a semiconductor material. In this embodiment, the semiconductor substrate 10 may include a plurality of the fin structures 10F. Each of the fin structures 10F is elongated in a first direction D1, the fin structures 10F are repeatedly disposed in a second direction D2, and the first direction D1 may be substantially orthogonal to the second direction D2, but not limited thereto. The fin structures 10F may be formed by a patterning process, such as a multiple patterning process, to the substrate 10, and the fin structures 10F may be separated from one another by a shallow trench isolation structure, such a second isolation structure 20 shown in FIG. 1 and FIG. 2. The shallow trench isolation structure may include a single layer or multiple layers of an insulation material, such as an oxide insulation material, but not limited thereto.

An emitter region R1, a base region R2, and a collector region R3 are defined in the bipolar junction transistor 101. The emitter region R1 and the collector region R3 are adjacent to and connected to two opposite sides of the base region R2 respectively, and the base region R2 is located between the emitter region R1 and the collector region R3.

In some embodiments, the emitter region R1 may be a center, the base region R2 may surround the emitter region R1 in a horizontal direction, and the collector region R3 may surround the base region R2 and the emitter region R1, but the present invention is not limited to this. Other possible allocation approaches for the emitter region, the base region, and the collector region are still within the contemplated scope of the present invention. Additionally, as shown in FIG. 1 and FIG. 2, the fin structures 10F located in the emitter region R1 may be defined as first fin structures F1, the fin structures 10F located in the base region R2 may be defined as second fin structures F2, and the fin structures 10F located in the collector region R3 may be defined as third fin structures F3. Therefore, each of the first fin structures F1, each of the second fin structures F2, and each of the third fin structures F3 may be elongated in the first direction D1 respectively.

Additionally, the bipolar junction transistor 101 may further include a first conductivity type well W1, a second conductivity type well W2, a first epitaxial layer 41, a second epitaxial layer 42, and a third epitaxial layer 43. The first conductivity type well W1 is disposed in the emitter region R1 and the base region R2, and the second conductivity type well W2 is disposed in the collector region R3. The first epitaxial layer 41 is disposed in the first fin structure F1, the second epitaxial layer 42 is disposed in the second fin structure F2, and the third epitaxial layer 43 is disposed in the third fin structure F3. Specifically, the first conductivity well W1 is formed in the semiconductor substrate 10 within the emitter region R1 and the base region R2. The first fin structures F1 and the second fin structures F2 are first conductivity type fin structures connected with the first conductivity type well W1. The second conductivity type well W2 is formed in the semiconductor substrate 10 within the collector region R3, and the third fin structures F3 are second conductivity type fin structures connected with the second conductivity type well W2. In addition, the first epitaxial layer 41 and the third epitaxial layer 43 may include a second conductivity type epitaxial material respectively, and the second epitaxial layer 42 may include a first conductivity type epitaxial material. For example, the first epitaxial layer 41, the second epitaxial layer 42, and the third epitaxial layer 43 may include silicon phosphide (SiP), silicon germanium (SiGe), silicon carbide (SiC), or other appropriate epitaxial materials. The first conductivity type may be complementary to the second conductivity type. The first conductivity type and the second conductivity type may be two different conductivity types complementary to one another, such as a P type and an N type. For example, when the first conductivity type is an N type and the second conductivity type is a P type, the bipolar junction transistor 101 may be regarded as a PNP bipolar junction transistor, and the bipolar junction transistor 101 may be regarded as an NPN bipolar junction transistor when the first conductivity type is a P type and the second conductivity type is an N type. In some embodiments, the semiconductor substrate 10 may be a second conductivity type substrate or a first conductivity type substrate with a second conductivity type deep well formed under the first conductivity type well W1 and the second conductivity type well W2 mentioned above.

Additionally, the bipolar junction transistor 101 may further include a plurality of gate structures G disposed straddling the fin structures 10F. For example, each of the gate structures G may be elongated in the second direction D2, cross the fin structures 10F, and be straddling the fin structures 10F, but not limited thereto. In some embodiments, the gate structures G and dummy gate structures (not shown) formed in another region, such as a field effect transistor region, on the semiconductor substrate 10 for a replacement metal gate (RMG) process may be formed together. Therefore, the material of the gate structures G may include semiconductor materials, such as polysilicon and amorphous silicon, but not limited thereto. In some embodiments, the gate structures G may include conductive materials or insulation materials according to other considerations. In addition, a spacer 50 may be formed on sidewalls of the gate structures G. The material of the spacer 50 may include oxide, nitride, oxynitride, or other suitable insulation materials, and the spacer 50 may be formed by single layer or multiple layers of the insulation materials mentioned above, but not limited thereto. The first epitaxial layer 41, the second epitaxial layer 42, and the third epitaxial layer 43 mentioned above may be formed in the fin structures 10F after the steps of forming the gate structures G and the spacer 50, but not limited thereto. Additionally, the bipolar junction transistor 10 may further include an interlayer dielectric layer 60 and a plurality of contact structures 70. The interlayer dielectric layer 60 may cover the semiconductor substrate 10, the second isolation structure 20, the gate structures G, the spacer 50, the first epitaxial layer 41, the second epitaxial layer 42, and the third epitaxial layer 43. The contact structures 70 may penetrate the interlayer dielectric layer 60 and be electrically connected to the first epitaxial layer 41, the second epitaxial layer 42, or the third epitaxial layer 43 respectively for forming the emitter, the base, and the collector of the bipolar junction transistor 101.

It is worth noting that, in the bipolar junction transistor 101, the first fin structures F1 in the emitter region R1 are separated from the second fin structure F2 in the base region R2 by the second isolation structure 20, and a part of the second isolation structure 20 is also formed between two adjacent fin structures 10F and formed at an outer side of the collector region R3. Additionally, the second isolation structure 20 may be formed by forming an insulation material layer on the semiconductor substrate 10 after the step of forming the fin structures 10F, the gaps between the fin structures 10F are filled with the insulation material layer, and an etching back process is then performed for forming the second isolation structure 20. Therefore, the length of the second isolation structure 20, such as a second length 20L in the first direction D1 shown in FIG. 2, cannot be reduced effectively (about 1.5 micrometers generally), and it is an obstacle for the purpose of enhancing the electrical performances, such as the current gain, of the bipolar junction transistor 101.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
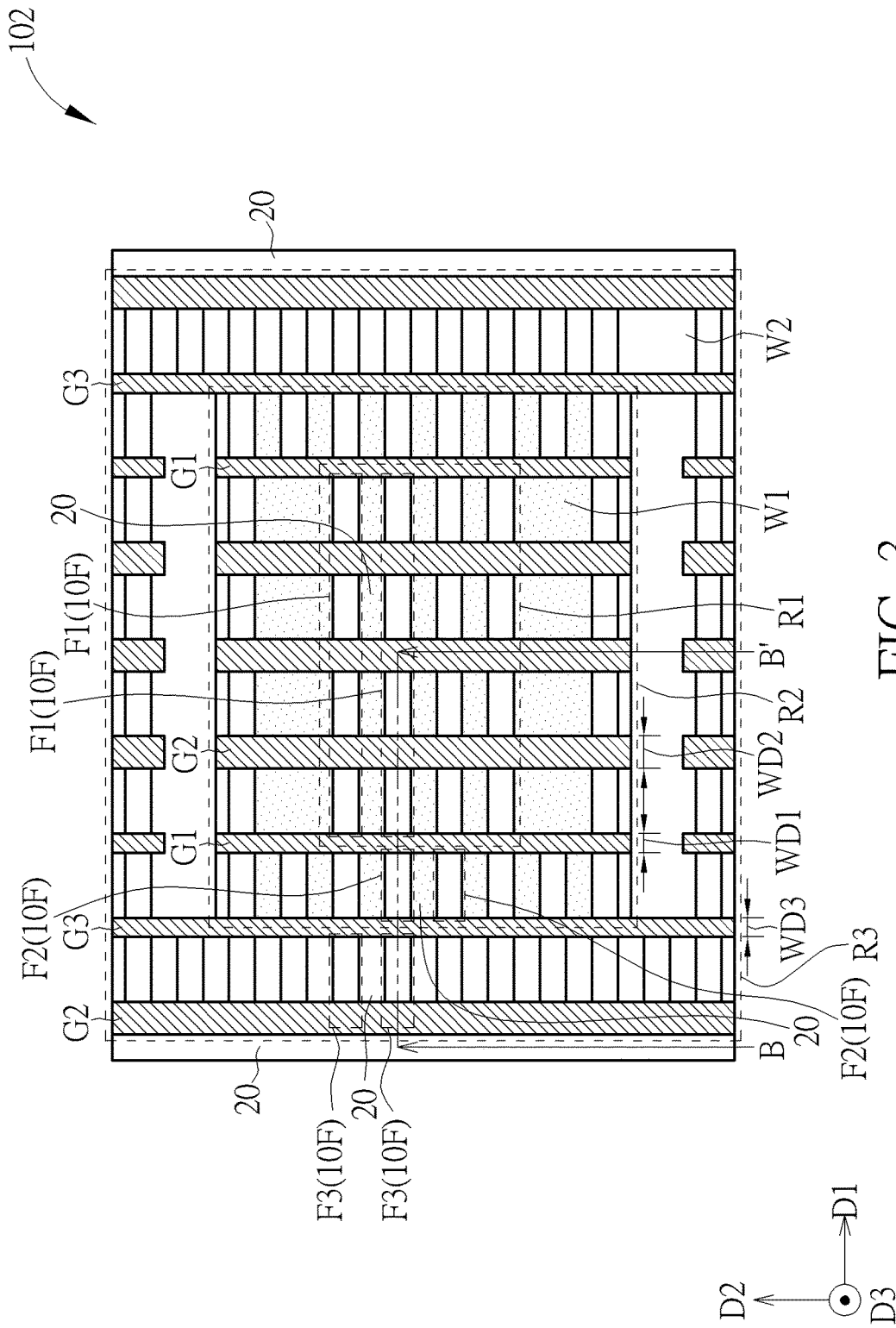
FIG. 3 is a schematic drawing illustrating a bipolar junction transistor according to a second embodiment of the present invention.
Figure 4:
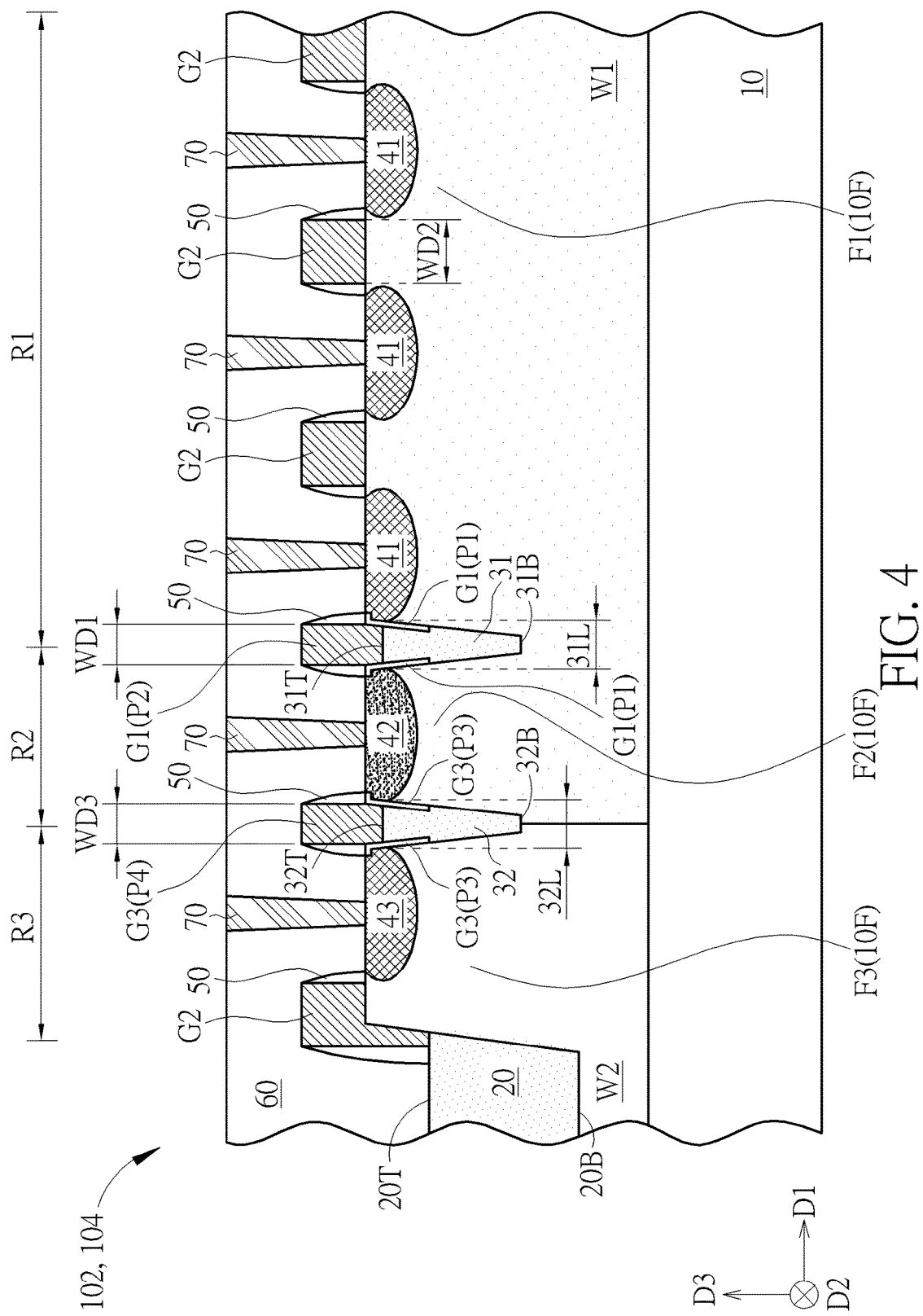
FIG. 4 is a cross-sectional diagram taken along a line B-B' in FIG. 3.

Please refer to FIG. 3 and FIG. 4. FIG. 3 is a schematic drawing illustrating a bipolar junction transistor according to a second embodiment of the present invention. FIG. 4 is a cross-sectional diagram taken along a line B-B' in FIG. 3. As shown in FIG. 3 and FIG. 4, a bipolar junction transistor 102 is provided in this embodiment. The bipolar junction transistor 102 includes the semiconductor substrate 10 and a first isolation structure 31. The semiconductor substrate 10 includes a plurality of the fin structures 10F, and the fin structures 10F include the first fin structures F1, the second fin structures F2, and the third fin structures F3. The first fin structures F2 are disposed in the emitter region R1, the second fin structures F2 are disposed in the base region R2, and the third fin structures F3 are disposed in the collector region R3. Each of the first fin structures F1, each of the second fin structures F2, and each of the third fin structures F3 are elongated in the first direction D1 respectively. The base region R2 is disposed adjacent to the emitter region R1, and the base region R2 is located between the emitter region R1 and the collector region R3. The first isolation structure 31 is disposed between the first fin structure F1 and the second fin structure F2, and a length of the first isolation structure 31 in the first direction D1 (such as a first length 31L shown in FIG. 4) is less than or equal to 40 nanometers. In other words, in comparison with the first embodiment mentioned above, the effective base width of the bipolar junction transistor 102 in this embodiment may be reduced because the first fin structure F1 in the emitter region R1 is separated from the second fin structure F2 in the base region R2 by the first isolation structure 31 with a relatively shorter length, and the current gain of the bipolar junction transistor 102 may be increased accordingly.

Additionally, in some embodiments, the bipolar junction transistor 102 may further include a third isolation structure 32 disposed between the second fin structure F2 in the base region R2 and the third fin structure F3 in the collector region R3, and a length of the third isolation structure 32 in the first direction D1, such as a third length 32L shown in FIG. 4, is less than or equal to 40 nanometers for further reducing the effective base width of the bipolar junction transistor 102, but not limited thereto. Specifically, in some embodiments, the first fin structure F1, the second fin structurer F2, and the third fin structure F3 adjacent to one another in the first direction D1 may be formed by forming the first isolation structure 31 and the third isolation structure 32 mentioned above in one identical fin structure 10F. In other words, one of the fin structures 10F may be divided into the first fin structure F1, the second fin structurer F2, and the third fin structure F3 by the first isolation structure 31 and the third isolation structure 32. Therefore, the first isolation structure 31 and the third isolation structure 32 may be formed after the step of forming the second isolation structure 20, and the first isolation structure 31 and the third isolation structure 32 may be formed by one or more process steps, which are different from the patterning process of forming the fin structures 10F, for forming trenches in the fin structure 10F and filling the trenches with an isolation material. Accordingly, under considerations of manufacturing ability and electrical characteristics of the devices, the length of the first isolation structure 31 and the length of the third isolation structure 32 may be controlled effectively to be as short as possible, such as less than or equal to 40 nanometers, for effectively reducing the base width. For example, the first isolation structure 31 and the third isolation structure 32 may be formed by the same process of forming a single diffusion break (SDB) in other fin structures 10F for separating two adjacent semiconductor devices, such as fin field effect transistors, in the same fin structure 10F from each other, but not limited thereto. The isolation material formed in the trenches mentioned above may include insulation materials, such as oxide insulation materials. The isolation material may be formed by a process, such as a flowable chemical vapor deposition (FCVD) process, and an anneal process may be selectively performed before the FCVD process for forming the first isolation structure 31 and the third isolation structure 32, but not limited thereto.

In some embodiments, the first isolation structure 31 is directly connected to and directly contacts the first fin structure F1 and the second fin structure F2, and the first fin structure F1 is isolation from the second fin structure F2 by the first isolation structure 31. The third isolation structure 32 is directly connected to and directly contacts the second fin structure F2 and the third fin structure F3, and the second fin structure F2 is isolation from the third fin structure F3 by the third isolation structure 32. Additionally, the second isolation structure 20 in this embodiment is at least partially disposed at an outer side of the collector region R3 and partly disposed between two adjacent fin structures 10F in the second direction D2. Generally, the depths of the first isolation structure 31 and the third isolation structure 32 are less than the height of the fin structure 10F in the vertical direction D3. Accordingly, and a top surface of the first isolation structure 31 (such as a first top surface 31T shown in FIG. 4) and a top surface of the third isolation structure 32 (such as a third top surface 32T shown in FIG. 4) are higher than a top surface of the second isolation structure 20 (such as a second top surface 20T shown in FIG. 4) in the vertical direction D3 respectively, and a bottom surface of the first isolation structure 31 (such as a first bottom surface 31B shown in FIG. 4) and a bottom surface of the third isolation structure 32 (such as a third bottom surface 32B shown in FIG. 4) are higher than a bottom surface of the second isolation structure 20 (such as a second bottom surface 20B shown in FIG. 4) in the vertical direction D3 respectively, but not limited thereto. In addition, the third top surface 32T of the third isolation structure 32 may be substantially coplanar with the first top surface 31T of the first isolation structure 31, and the third bottom surface 32B of the third isolation structure 32 may be substantially coplanar with the first bottom surface 31B of the first isolation structure 31 because the first isolation structure 31 and the second isolation structure 32 may be formed by the same manufacturing process, but not limited thereto. In some embodiments, the third isolation structure 32 having a height and/or a depth different from a height and/or a depth of the first isolation structure 31 may also be formed according to other considerations.

As shown in FIG. 3 and FIG. 4, the bipolar junction transistor 102 may further include a plurality of first gate structures G1, a plurality of second gate structures G2, and a plurality of third gate structures G3. Each of the first gate structures G1, each of the second gate structures G2, and each of the third gate structures G3 may be elongated in the second direction D2 and parallel with one another, but not limited thereto. One of the first gate structures G1 is at least partially disposed on the first isolation structure 31, one of the third gate structures G3 is at least partially disposed on the third isolation structure 32, and at least one of the second gate structures G2 is disposed on the first fin structure F1 and straddling the first fin structure F1. A part of the second gate structures G2 may also be disposed on the third fin structure F3 and straddling the third fin structure F3. The spacer 50 may be formed on sidewalls of the first gate structures G1, the second gate structures G2, and the third gate structures G3. The first epitaxial layer 41, the second epitaxial layer 42, and the third epitaxial layer 43 are disposed in the first fin structure F1, the second fin structure F2, and the third fin structure F3 respectively. Therefore, the first gate structure G1 disposed on the first isolation structure 31 is disposed between the first epitaxial layer 41 and the second epitaxial layer 42 in the first direction D1, and the third gate structure G3 disposed on the third isolation structure 32 is disposed between the second epitaxial layer 42 and the third epitaxial layer 43 in the first direction D1. The first gate structure G1 and the third gate structure G3 are formed corresponding to the first isolation structure 31 and the third isolation structure 32 in the vertical direction D3 respectively, and the forming conditions of the first epitaxial layer 41, the second epitaxial layer 42, and the third epitaxial layer 43 will be influenced by the widths of the first gate structure G1 and the third gate structure G3 in the first direction D1. Therefore, the width of the first gate structure G1 (such as a first width WD1 shown in FIG. 4) and the width of the third gate structure G3 (such as a third width WD3 shown in FIG. 4) may be substantially equal to the length of the first isolation structure 31 and the length of the third isolation structure 32 respectively. The first width WD1 of the first gate structure G1 and the third width WD3 of the third gate structure G3 are less than the width of each of the second gate structures G2 (such as a second width WD2 shown in FIG. 4) respectively.

As shown in FIG. 4, in some embodiments, the first gate structure G1 may include a dielectric layer P1 and a gate electrode P2. The dielectric layer P1 is disposed on the first fin structure F1 and the second fin structure F2. The gate electrode P2 is partly disposed on the dielectric layer P1 and partly disposed on the first isolation structure 31. Specifically, the dielectric layer P1 and a dielectric layer (not shown) required in other semiconductor devices formed on the fin structure 10F, such as fin field effect transistors, may be formed together by the same process, and the dielectric layer P1 may include a silicon oxide layer or other appropriate dielectric materials. When the material of the first isolation structure 31 is nitride, such as silicon nitride, and the dielectric layer P1 is formed by a thermal treatment, the dielectric layer P1 will be formed on the exposed part of the fin structure 10F and will not be directly formed on the top surface of the first isolation structure 31. Accordingly, a part of the dielectric layer P1 is disposed on the first fin structure F1 and the second fin structure F2 in the vertical direction D3, a part of the dielectric layer P1 is disposed on sidewalls of the first fin structure F1 and the second fin structure F2, and an upper portion of the first isolation structure 31 may be sandwiched by the dielectric layer P1 in the first direction D1, but not limited thereto. In other words, the first gate structure G1 disposed on the first isolation structure 31 may directly contact the first fin structure F1 and the second fin structure F2 located at two sides of the first isolation structure 31 in the first direction D1. Additionally, the third gate structure G3 may also include a dielectric layer P3 and a gate electrode P4. The dielectric layer P3 is disposed on the second fin structure F2 and the third fin structure F3. The gate electrode P4 is partly disposed on the dielectric layer P3 and partly disposed on the third isolation structure 32. The material of the dielectric layer P3 may be identical to the material of the dielectric layer P1 of the first gate structure G1, and the dielectric layer P3 and the dielectric layer P1 may be formed together by the same manufacturing process, but not limited thereto.

A part of the dielectric layer P3 is disposed on the second fin structure F2 and the third fin structure F3 in the vertical direction D3, a part of the dielectric layer P3 is disposed on sidewalls of the second fin structure F2 and the third fin structure F3, and an upper portion of the third isolation structure 32 may be sandwiched by the dielectric layer P3 in the first direction D1, but not limited thereto. In other words, the third gate structure G3 disposed on the third isolation structure 32 may directly contact the second fin structure F2 and the third fin structure F3 located at two sides of the third isolation structure 32 in the first direction D1.

Figure 5:
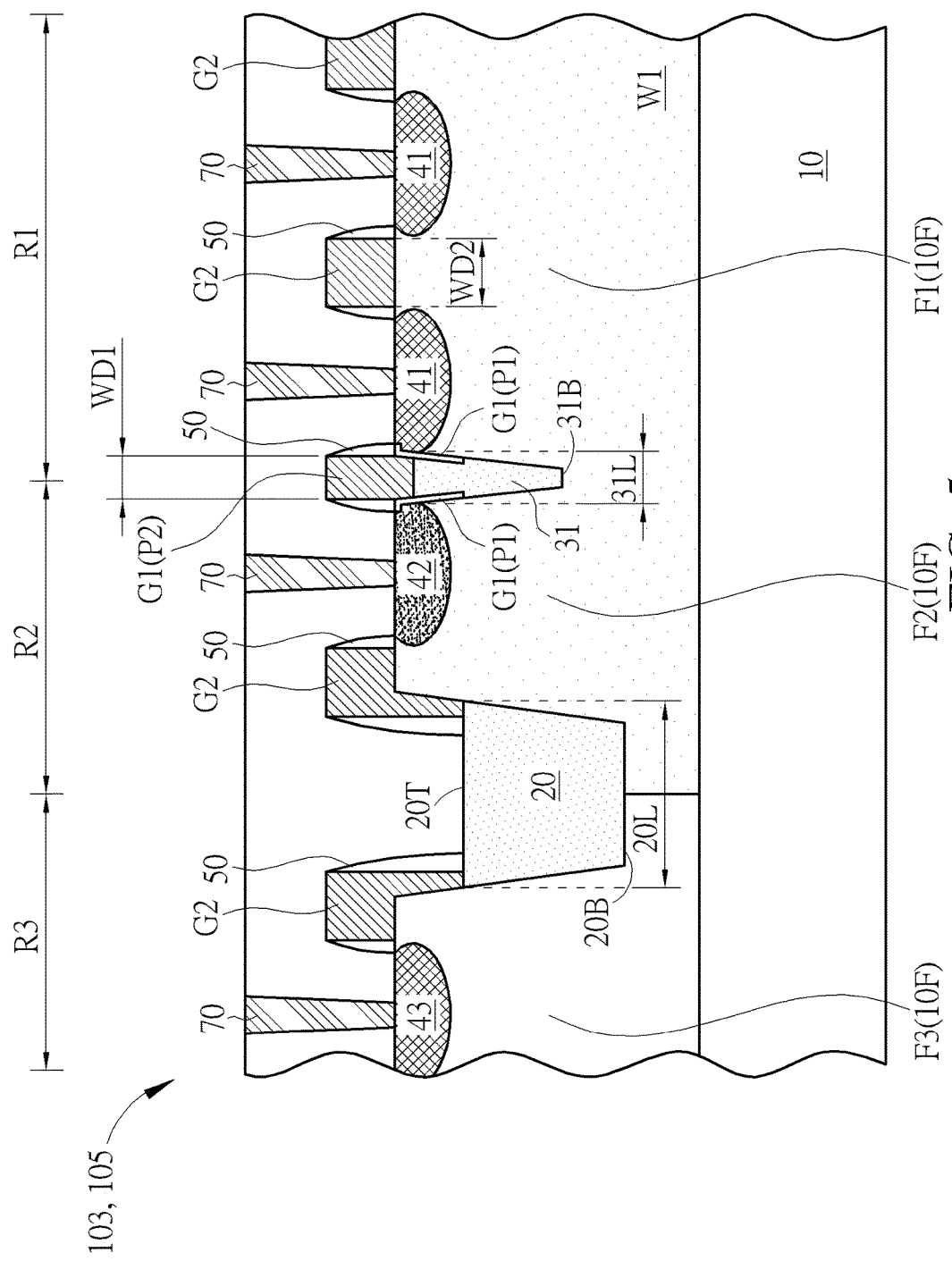
FIG. 5 is a schematic drawing illustrating a bipolar junction transistor according to a third embodiment of the present invention.

Please refer to FIG. 5. FIG. 5 is a schematic drawing illustrating a bipolar junction transistor according to a third embodiment of the present invention. As shown in FIG. 5, the differences between a bipolar junction transistor 103 of this embodiment and the bipolar junction transistor of the second embodiment mentioned above is that the second fin structure F2 and the third fin structure F3 are separated from one another by the second isolation structure 20 in the bipolar junction transistor 103, and the bipolar junction transistor 103 does not include the third isolation structure and the third gate structure described in the second embodiment mentioned above. Accordingly, the third fin structure F3 may be formed before the step of forming the first isolation structure 31, and the first fin structure F1 and the second fin structure F2 may be separated from one another by the first isolation structure in the bipolar junction transistor 103 for reducing the effective base width of the bipolar junction transistor.

Figure 6:
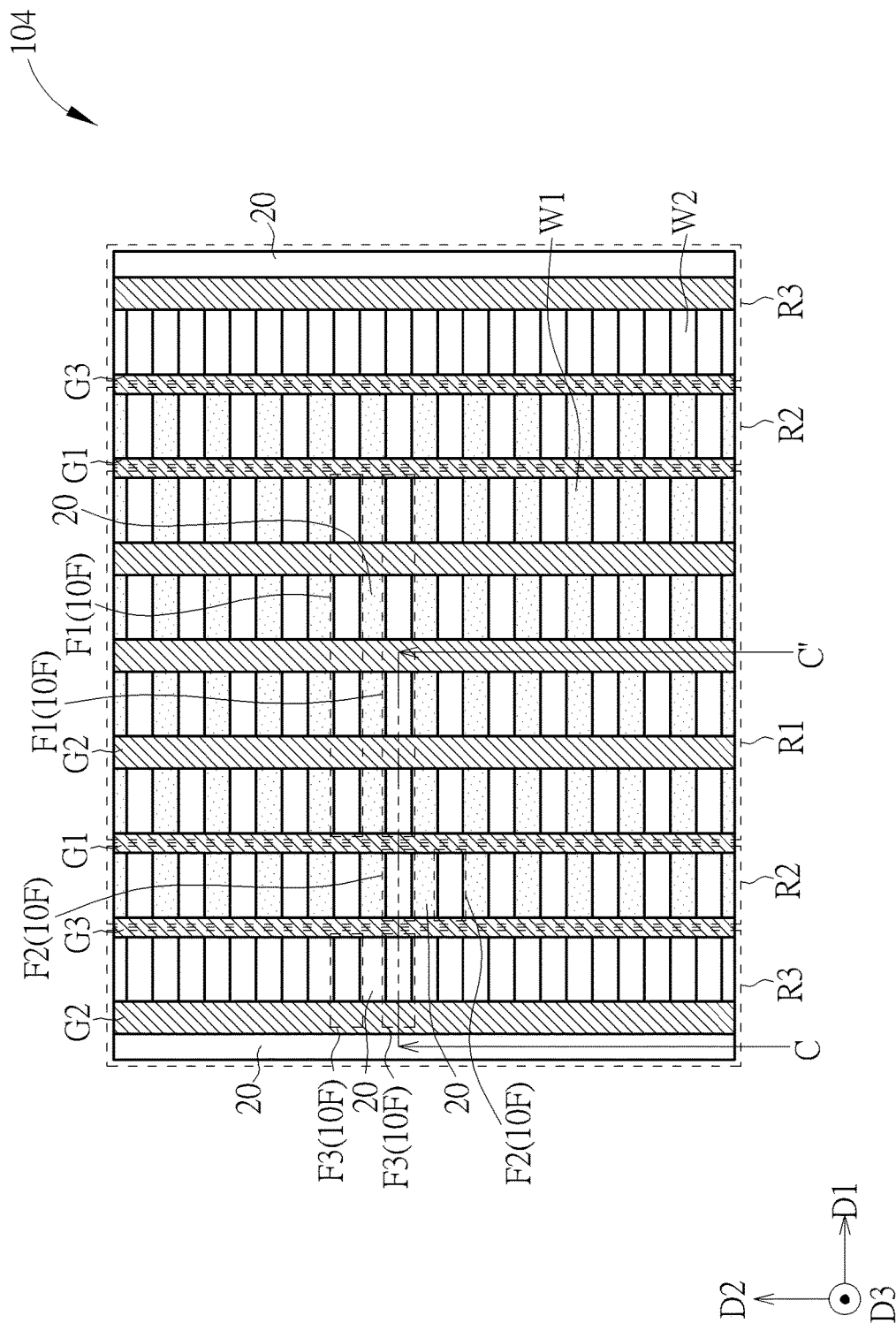
FIG. 6 is a schematic drawing illustrating a bipolar junction transistor according to a fourth embodiment of the present invention.

Please refer to FIG. 6 and FIG. 4. FIG. 6 is a schematic drawing illustrating a bipolar junction transistor 104 according to a fourth embodiment of the present invention. FIG. 6 is a top-view diagram, and FIG. 4 may also be regarded as a cross-sectional diagram taken along a line C-C' in FIG. 6. As shown in FIG. 6 and FIG. 4, the difference between this embodiment and the second embodiment mentioned above is that, in the bipolar junction transistor 104 of this embodiment, the emitter region R1, the base region R2, and the collector region R3 are disposed sequentially in the first direction D1, the base region R2 may not surround the emitter region R1, and the collector region R3 may not surround the base region R2 and the emitter region R1. For example, as shown in FIG. 6, one collector region R3, one base region R2, one collector region R3, another one base region R2, and another one collector region R3 may be sequentially disposed in the first direction D1.

Figure 7:
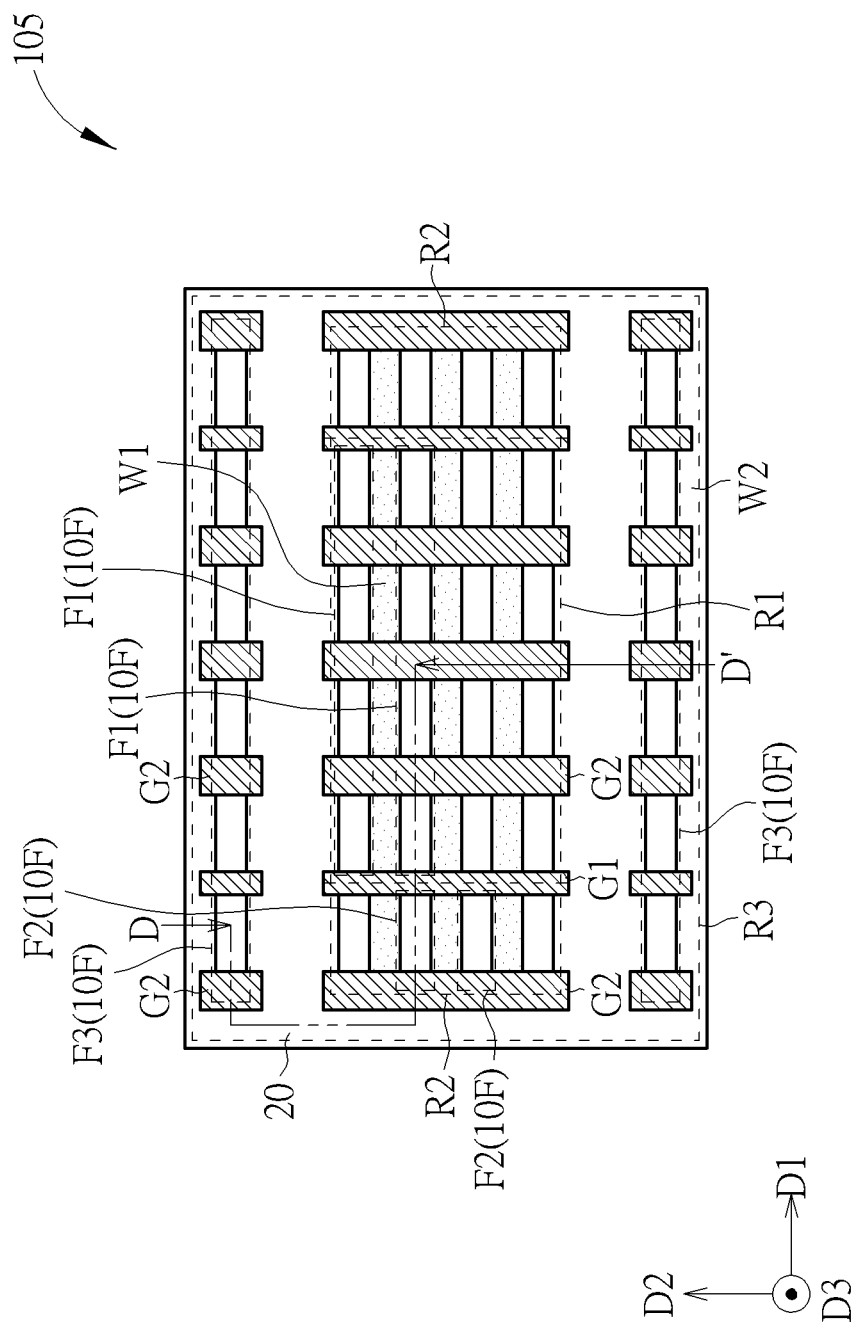
FIG. 7 is a schematic drawing illustrating a bipolar junction transistor according to a fifth embodiment of the present invention.

Please refer to FIG. 7 and FIG. 5. FIG. 7 is a schematic drawing illustrating a bipolar junction transistor 105 according to a fifth embodiment of the present invention. FIG. 7 is a top-view diagram, and FIG. 5 may also be regarded as a cross-sectional diagram taken along a line D-D' in FIG. 7. As shown in FIG. 7 and FIG. 5, the difference between this embodiment and the third embodiment mentioned above is that the bipolar junction transistor 105 of this embodiment may include one emitter region R1 disposed with two base regions R2 and two collector regions R3. The two base regions R2 are disposed at two sides of the emitter region R1 in the first direction D1 respectively, and the two collector regions R3 are disposed at two sides of the base regions R2 and the emitter region R1 in the second direction D2 respectively.

It is worth noting that the allocation design of the emitter region, the base region, and the collector region in the bipolar junction transistor of the present invention is not limited to the conditions of the embodiments described above, and other possible allocation approaches for the emitter region, the base region, and the collector region are still within the contemplated scope of the present invention.

To summarize the above descriptions, according to the bipolar junction transistor in the present invention, the isolation structure with relatively shorter length is used to separate the fin structure in the emitter region and the fin structure in the base region for reducing the effective base width of the bipolar junction transistor. Accordingly, the current gain of the bipolar junction transistor may be enhanced, and the device dimension of the bipolar junction transistor may be reduced for increasing the integrity of the integrated circuit. Additionally, the isolation structure disposed between the fin structure in the emitter region and the fin structure in the base region may be formed by the process of forming the diffusion break configured to separating two adjacent semiconductor devices. The manufacturing processes of the fin field effect transistors and the bipolar junction transistor of the present invention may be integrated effectively, and the performance of the bipolar junction transistor may be enhanced too.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bipolar junction transistor (BJT), comprising:
   a semiconductor substrate, comprising:
   a first fin structure disposed in an emitter region;
   a second fin structure disposed in a base region adjacent to the emitter region; and
   a third fin structure disposed in a collector region, wherein the first fin structure, the second fin structure, and the third fin structure are elongated in a first direction respectively, and the base region is located between the emitter region and the collector region; and
   a first isolation structure disposed between the first fin structure and the second fin structure in the first direction, wherein a length of the first isolation structure in the first direction is less than or equal to 40 nanometers.

2. The BJT of claim 1, wherein the first isolation structure is directly connected to the first fin structure and the second fin structure, and the first fin structure is separated from the second fin structure by the first isolation structure.

3. The BJT of claim 1, further comprising:
   a second isolation structure at least partially disposed at an outer side of the collector region.

4. The BJT of claim 3, wherein a top surface of the first isolation structure is higher than a top surface of the second isolation structure in a vertical direction.

5. The BJT of claim 3, wherein a bottom surface of the first isolation structure is higher than a bottom surface of the second isolation structure in a vertical direction.

6. The BJT of claim 1, further comprising:
   a first gate structure, wherein at least a part of the first gate structure is disposed on the first isolation structure.

7. The BJT of claim 6, further comprising:
   a plurality of second gate structures, wherein at least one of the second gate structures is disposed on the first fin structure and straddling the first fin structure.

8. The BJT of claim 7, wherein the first gate structure and each of the second gate structures are elongated in a second direction, and the first gate structure and the second gate structures are parallel to one another.

9. The BJT of claim 7, wherein a width of the first gate structure is smaller than a width of each of the second gate structures.

10. The BJT of claim 6, further comprising:
    a first epitaxial layer disposed in the first fin structure; and
    a second epitaxial layer disposed in the second fin structure, wherein the first gate structure disposed on the first isolation structure is disposed between the first epitaxial layer and the second epitaxial layer in the first direction.

11. The BJT of claim 6, wherein the first gate structure comprises:
    a dielectric layer disposed on the first fin structure and the second fin structure; and
    a gate electrode partly disposed on the dielectric layer and partly disposed on the first isolation structure.

12. The BJT of claim 11, wherein a part of the dielectric layer is disposed on the first fin structure and the second fin structure in a vertical direction, and a part of the dielectric layer is disposed on sidewalls of the first fin structure and the second fin structure.

13. The BJT of claim 1, further comprising:
    a third isolation structure disposed between the second fin structure and the third fin structure, wherein a length of the third isolation structure in the first direction is less than or equal to 40 nanometers.

14. The BJT of claim 13, wherein the third isolation structure is directly connected to the second fin structure and the third fin structure, and the second fin structure is separated from the third fin structure by the third isolation structure.

15. The BJT of claim 13, wherein a top surface of the third isolation structure is substantially located at the same level with a top surface of the first isolation structure.

16. The BJT of claim 13, wherein a bottom surface of the third isolation structure is substantially located at the same level with a bottom surface of the first isolation structure.

17. The BJT of claim 13, further comprising:
    a plurality of second gate structures, wherein at least one of the second gate structures is disposed on the first fin structure and straddling the first fin structure; and
    a third gate structure, wherein at least a part of the third gate structure is disposed on the third isolation structure.

18. The BJT of claim 17, wherein a width of the third gate structure is smaller than a width of each of the second gate structures.

19. The BJT of claim 17, further comprising:
    a second epitaxial layer disposed in the second fin structure; and
    a third epitaxial layer disposed in the third fin structure, wherein the third gate structure disposed on the third isolation structure is disposed between the second epitaxial layer and the third epitaxial layer in the first direction.

20. The BJT of claim 1, further comprising:
    a first conductivity type well disposed in the emitter region and the base region; and
    a second conductivity type well disposed in the collector region.

* * * * *